United States Patent
Pan

(10) Patent No.: US 9,466,337 B1
(45) Date of Patent: Oct. 11, 2016

(54) APPARATUSES AND METHOD FOR SUPPLY VOLTAGE LEVEL DETECTION

(71) Applicant: Micron Technology, Inc., Boise, ID (US)

(72) Inventor: Dong Pan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/832,583

(22) Filed: Aug. 21, 2015

(51) Int. Cl.
| | |
|---|---|
| *G11C 5/14* | (2006.01) |
| *G05F 5/00* | (2006.01) |
| *H03K 5/153* | (2006.01) |
| *G11C 11/4074* | (2006.01) |
| *G01R 19/00* | (2006.01) |
| *G01R 19/165* | (2006.01) |

(52) U.S. Cl.
CPC .......... *G11C 5/143* (2013.01); *G01R 19/0084* (2013.01); *G01R 19/16566* (2013.01); *G05F 5/00* (2013.01); *G11C 5/147* (2013.01); *G11C 11/4074* (2013.01); *H03K 5/153* (2013.01)

(58) Field of Classification Search
CPC .. G11C 5/147; G11C 11/4074; H03K 5/153; G01R 19/0084; G01R 19/16566; G05F 5/00
See application file for complete search history.

(56) References Cited

U.S. PATENT DOCUMENTS

| | | | | |
|---|---|---|---|---|
| 5,301,161 A * | 4/1994 | Landgraf | ............... | G11C 5/143 365/185.04 |
| 6,429,743 B2 * | 8/2002 | Iga | ...................... | H03F 3/45183 330/252 |
| 6,452,854 B1 * | 9/2002 | Kato | ..................... | G11C 5/147 257/E27.062 |
| 7,548,799 B2 * | 6/2009 | Landry | .................. | H04L 12/10 323/267 |

OTHER PUBLICATIONS

Baker, Jacob et al., "CMOS Circuit Design, Layout, and Simulation", IEEE Press Series on Microelectronic Systems, 1997, p. 480.

* cited by examiner

*Primary Examiner* — J. H. Hur
*Assistant Examiner* — Ajay Ojha
(74) *Attorney, Agent, or Firm* — Dorsey & Whitney LLP

(57) ABSTRACT

Example apparatuses and methods may detect when one or more supply voltage levels have reached a trigger voltage. An example apparatus may include a terminal, a voltage reference circuit and a voltage detector circuit. The terminal may be configured to receive a first voltage, and the voltage reference circuit may be coupled to the terminal. The voltage reference circuit may be configured to receive the first voltage and provide a second voltage responsive, at least in part, to the first voltage. The voltage detector circuit may be configured to respond, at least in part, to the first and second voltages, and further configured to produce an output signal when the first voltage reaches a target level. The voltage detector circuit may include a first transistor including a gate configured to receive the second voltage, and a first resistor coupled in series between the terminal and the transistor.

21 Claims, 4 Drawing Sheets

APPARATUSES AND METHOD FOR SUPPLY VOLTAGE LEVEL DETECTION

BACKGROUND

Some semiconductor integrated circuits (ICs) may use multiple power supplies to power internal operation, which may be external to the ICs and provided by a host system. As may often be the case, a different voltage may be provided by each of the multiple power supplies. The different voltages may be used to power different areas of the ICs and/or to power different functions performed by the ICs. When the host system powers up, however, the multiple power supplies may ramp from zero volts to their specified voltages at different rates. If an IC, for example, is powered up at a time when voltages provided by one or more of the multiple power supplies are at undesirable values with respect to one another, then the IC may not power up correctly.

DETAILED DESCRIPTION

Figure 1:
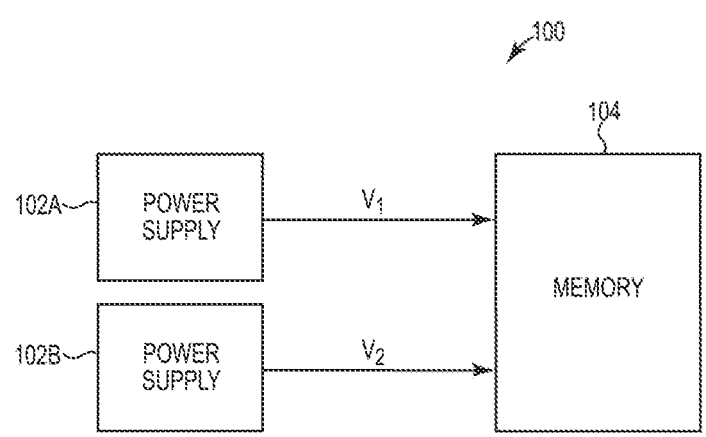
FIG. 1 is a block diagram of a system in accordance with an embodiment of the present disclosure.

Apparatuses and methods for detection of supply voltage levels are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some memories may receive supply voltages from multiple external power supplies for their intended operation. Each of the multiple power supplies may provide voltages at a respective specified voltage level. The specified voltage levels may be different voltage levels in some embodiments. To ensure memories do not operate when supply voltages are not at their specified levels, memories may include supply voltage level detector circuits that monitor one or more of the supply voltages provided by the external voltage sources. These supply voltage level detector circuits may monitor externally provided voltages during various operational modes of the memories. For example, when a host system is powered up from an off state, the external power supplies may begin to ramp their respective supply voltages from zero volts to their respective specified output voltage levels. During this ramp up time, the voltage level detector circuits may determine when the voltage levels of one or more of the power supplies have reached a trigger voltage, at which time the supply voltage level detector circuits may enable one or more internal circuits of the memory. The one or more internal circuits of the memory may include various internal voltage generators/regulators that provide internal power to various circuits of the memory.

Conventional supply voltage level detector circuits may display variation in their designed trigger voltage that may adversely affect power up of a host memory. The variation may be due to changing operational temperatures and further due to variations in the semiconductor processing. In certain instances, however, the variation in trigger voltage may be larger than a memory may tolerate. If, for example, the trigger voltage falls too low due to the variation, the supply voltage level detector circuit may enable internal circuits prematurely. Enabling the internal circuits prematurely may lead to latch up, for example. Likewise for instances when the trigger voltage increases too high due to the variation, the memory may also be enabled at a time when the memory functions improperly. For example, if the memory should not be enabled until a higher specified power supply is greater than a lower specified power supply, the trigger voltage may be selected somewhere between the two specified values. For example, if one power supply is specified to provide a low voltage, 1.2 volts for example, and a second power supply is specified to provide a high voltage, 1.8 volts for example, it may be desirable to select the trigger voltage to be between the two voltages, 1.4 volts for example.

Conventionally, however, the actual voltage provided by the power supplies may vary. For example, the supply voltages provided by the power supplies may vary by as much as +/−5%. However, if the variation in trigger voltage is large enough to fall below the maximum specified output of the lower supply and rise above the minimum specified output of the higher supply, then the memory may enable the internal power supplies at an undesirable time, e.g., when the voltage provided by the lower specified supply is greater than the voltage provided by the higher specified supply. This scenario may lead to latch up, for example. Outside of the processing effects on the trigger voltage variation, as previously discussed the operating temperature may be also effect the variation. As such, it may be desirable to reduce temperature variation of the trigger voltage of a supply voltage level detector circuit of a memory.

One solution to this problem may be a supply voltage level detector circuit that reduces and or eliminates the temperature induced variation of the trigger voltage. As will be discussed below in more detail, a supply voltage level detector circuit may include a plurality of transistors, resistors, and an inverter configured to detect when a supply voltage has reached a trigger voltage, and provide an enable signal in response. Various parameters of the resistors and transistors, e.g., relative size, relative gain, and transistor threshold voltage, may be selected such that the temperature variation of the trigger voltage is reduced or eliminated.

FIG. 1 is a block diagram of a system 100 in accordance with an embodiment of the present disclosure. The system 100 may at least include a plurality of power supplies 102, such as power supplies 102A, 102B, and a memory 104. While only two power supplies are shown in FIG. 1, any number of power supplies may fall within the contours of the present disclosure. Each of the power supplies 102 may provide at least one voltage, such as voltage V1 and voltage V2, to the memory 104. The memory 104 may use the supply voltages to generate various internal voltages. The various internal voltages may be used by different circuits of the memory 104 for operation of their respective functions. For example, a memory cell array may receive one supply voltage while circuits of surrounding functional blocks, such as input/output circuits, command logic circuits, address logic circuits, programming circuits, etc., may receive one or more other supply voltages. In some embodiments, each of the supply voltages may be different. The memory 104 may enable internal circuitry, such as internal voltage generators/regulators once one or more of the received supply voltages have reached a trigger voltage. The trigger voltage may be selected to prevent latch up, for example.

The memory 104 may monitor the received supply voltages as they ramp from an off state, for example, to their specified voltage levels and enable one or more internal voltage generators/regulators once one or more of the supply voltages have reached a trigger voltage. For example, the memory 104 may detect when the supply voltage V1 has reached a trigger voltage, and enable one or more internal voltage generators/regulators in response. The one or more internal voltage generators/regulators may provide various internal supply voltages so that the memory 104 operates as intended. Each of the one or more internal voltage generators/regulators may provide internal supply voltages based on supply voltages V1, V2, or both V1 and V2. In some embodiments, if the internal voltage generators/regulators are enabled incorrectly, for example, at a time when the voltage V2 is greater than the voltage V1 for example, then latch up may occur in the memory 104, which may cause the memory 104 not to operate as intended. By selecting a trigger voltage that may ensure that V1 is greater than V2 before enabling the internal voltage generators/regulators, the memory 104 may prevent or reduce the chance of latch up.

As discussed above, the trigger voltage may be affected by an operating temperature of the memory 104. Temperature effects may cause the trigger voltage to vary. For example, as the operating temperature increases, the trigger voltage may decrease. If, however, the variation in trigger voltage for detecting V1 falls below a maximum voltage of V2 then there may be a chance the memory 104 prematurely enables the internal voltage generators/regulators resulting in latch up. Accordingly, parameters of a supply voltage level detector circuit included in the memory 104 may be selected to minimize the temperature variation of the trigger voltage. Thus, selection of the circuit parameters and the trigger voltage may reduce or eliminate the chance of latch up due to premature enablement of the internal voltage generators/regulators.

Figure 2:
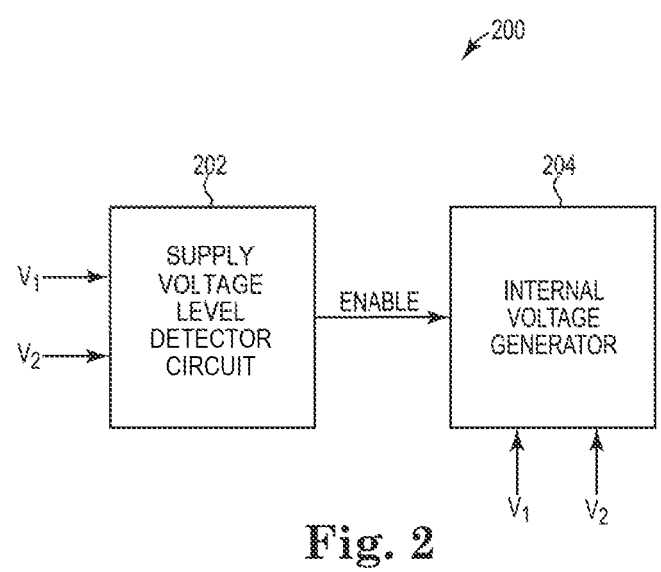
FIG. 2 is an apparatus in accordance with an embodiment of the present disclosure.

FIG. 2 is an apparatus 200 in accordance with an embodiment of the present disclosure. In some embodiments, the apparatus 200 may be a memory, such as a volatile or non-volatile memory. In other embodiments, the apparatus 200 may be any device that includes a supply voltage level detector circuit to monitor external supply voltages in order to enable various internal components/functions. The apparatus 200 may include a supply voltage level detector circuit 202, and internal voltage generator 204. The supply voltage level detector circuit 202 may receive supply voltages from one or more power supplies, and provide an enable signal to the internal voltage generator 204 when at least one of the voltage inputs has reached a trigger voltage.

The internal voltage generator 204 may include one or more voltage generators and or regulators that provide various voltage levels internally for a component, such as the memory 104 of FIG. 1. The one or more voltage generators may include low voltage regulators and high voltage generators, such as charge pumps, or a combination of both. The internal voltage generator 204 may receive external supply voltages V1 and V2, and an enable signal from the supply voltage level detector circuit 202. The number of supply voltages received is a non-limiting aspect of the present disclosure, and fewer or greater numbers of supply voltages are contemplated by the present disclosure. In some examples, the voltage V1 may be greater than the voltage V2.

The supply voltage level detector circuit 202 may include one or more circuit and/or logic components and provide an enable signal to the internal voltage generators 204 in response to one of the supply voltages V1 and/or V2 reaching a trigger voltage. The supply voltage level detector circuit 202 may receive the supply voltages V1 and V2, and monitor their change in value during start up, e.g., monitor their voltage levels ramping from zero to their respective specified voltage values. When the supply voltage level detector circuit 202 detects that at least one of the supply voltages, V1 for example, has reached the trigger voltage, the supply voltage level detector circuit 202 may provide the enable signal ENABLE to the internal voltage generator 204.

As discussed above, the supply voltages V1 and V2 may be provided at different specified voltage values. For example V1 may be greater than V2. Because the supply voltages V1 and V2 may ramp at different rates when enabled, the supply voltage level detector circuit 202 may detect when V1 has reached the trigger voltage. The trigger voltage may be selected to prevent or reduce the chance of latch up occurring in the apparatus 200, for example. Latch up may occur if the internal voltage generator 204 is enabled at a time when V2 is greater than V1, and latch up may be prevented if the internal voltage generator 204 is enabled at a time when V1 is greater than V2, which may be determined by the trigger voltage. In some embodiments, the trigger voltage may be selected to be above a maximum level that V2 may reach.

Additionally, internal design parameters and configuration of the supply voltage level detector circuit 202 may be selected to reduce the temperature-based variation in the trigger voltage. For example, various resistance values and transistor characteristics, as will be discussed below, may be selected to reduce or eliminate the temperature-based variation for a given trigger voltage. In some embodiments, the trigger voltage may be chosen based on the specified voltages of V1 and V2, and further chosen to ensure that the internal voltage generator 204 is not enabled until V1 is greater than V2. For example, a trigger voltage of 1.4 volts may be selected based on a supply voltage V1 of 1.8 volts and a supply voltage V2 of 1.2 volts. Further, based on a trigger voltage of 1.4 volts and a given design configuration, the various parameters of the supply voltage level detector circuit 202 may be selected to ensure the temperature-based variation of the trigger voltage stays outside of the inherent variations of supply voltages V1 and V2. The selected trigger value and parameters of the supply voltage level detector circuit 202 may reduce or eliminate the potential for latch up of the apparatus 200.

Figure 3:
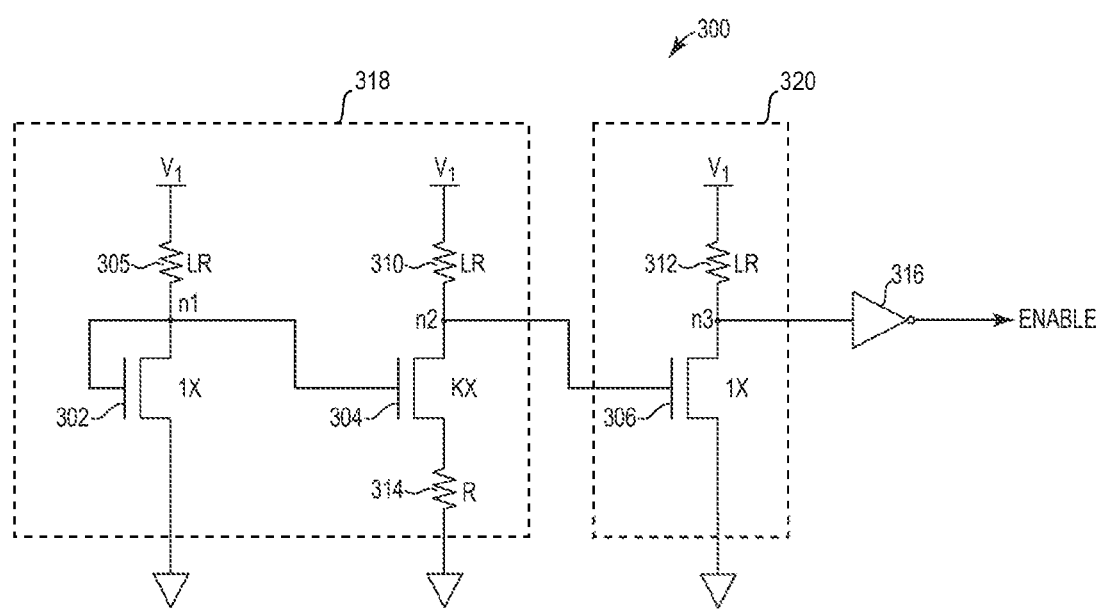
FIG. 3 is an example schematic of a supply voltage level detector circuit in accordance with an embodiment of the present disclosure.

FIG. 3 is an example schematic of a supply voltage level detector circuit 300 in accordance with an embodiment of the present disclosure. The supply voltage level detector circuit 300 may detect when a supply voltage has reached a trigger voltage, and provide an enable signal ENABLE in response. In some embodiments the enable signal is a digital signal. The supply voltage level detector circuit 300 may be an example of the supply voltage level detector circuit 202 of FIG. 2. The supply voltage level detector circuit 300 may include transistors 302, 304, and 306, resistors 308-314, and an inverter 316 substantially configured as depicted in FIG. 3. The supply voltage level detector circuit 300 may monitor a supply voltage to which each of the three transistors may be coupled, and in response to the supply voltage reaching a trigger voltage, provide an enable signal via the inverter 316.

In some embodiments, each of the transistors 302, 304, and 306 may be n-channel transistors with a size, e.g., a channel area, as shown on FIG. 3. For example, the transistors 302 and 306 may be of size 1X, while the transistor 304 may be of size KX. As such, the transistor 304 may be K times larger than the transistors 302, 306. As will be shown below, the various component parameters K may play a role in determining the temperature effect on the supply voltage level detector circuit 300, e.g., the temperature effect on the trigger voltage. The threshold voltage of each of the transistors 302, 304, and 306, however, may be substantially the same in some embodiments.

In some embodiments, each of the resistors 308-312 may provide a similar resistance value LR, while the resistor 314 may provide a resistor value of R. In some embodiments, the resistors 308-312 may provide L times greater resistance than the resistor 314. The relative difference in resistance resulting from the component parameter L, may affect the temperature effect of the supply voltage level detector circuit 300, e.g., the variation in the trigger voltage, as will be discussed below. The inverter 306 may be a conventional inverter as known to those of skill in the art, and may provide a digital output signal.

The supply voltage level detector circuit 300 may be, for ease of discussion, described as including three branches. A first branch may include the resistor 305 coupled between a drain of the transistor 302 and a first supply voltage terminal, and the transistor 302 may be further coupled to a second supply voltage terminal. The first supply voltage terminal may receive a high supply voltage, such as supply voltage V1 discussed above. The second supply terminal may be coupled to ground, for example. In some embodiments, the second terminal may provide a voltage other than ground, which may be between ground and a voltage on the first terminal. The transistor 302 may further be diode-coupled, such that a gate of the transistor 302 may be coupled to a node n1. A second branch of the supply voltage level detector circuit 300 may include the resistor 310 coupled between a drain of the transistor 304 and the first supply voltage terminal, and the transistor 304 may be further coupled to the second supply voltage terminal via the resistor 314. A gate of the transistor 304 may be coupled to the node n1. The resistor 310 and the transistor 304 are coupled at a node n2. A third branch of the supply voltage level detector circuit 300 may include the resistor 312 coupled between a drain of the transistor 306 and the first supply voltage terminal, and further coupled to the second supply voltage terminal by a source of the transistor 306. A gate of the transistor 306 may be coupled to node n2, and the resistor 312, the transistor 306, and an input of the inverter 316 are coupled at a node n3.

The first two branches of the supply voltage level detector circuit 300 may be characterized as a voltage reference circuit 318, while the third branch may be characterized as a voltage detector circuit 320. As a first voltage provided by the first supply voltage terminal increases from zero to a specified voltage, for example, the voltage reference circuit 318 may provide a second voltage to the voltage detector circuit 320. Based on the first voltage reaching the trigger voltage, the voltage detector circuit may provide an output signal. The output signal may be received by the inverter 316, which may in turn provide the digital enable signal ENABLE.

Stated another way, as currents flowing through all three branches of the supply voltage level detector circuit 300 equalize, the voltage on the node n3 may cause the output of the inverter 316 to provide a logic level high signal, e.g., the enable signal ENABLE. The equalization of the currents flowing in all three branches may result in a voltage on the node n3 falling low enough so that the inverter 316 switches from a low logic level output, e.g., a "0," to a high logic level output, e.g., a "1." The high logic level output may be the enable signal in some embodiments. The logic level of the present disclosure, however, is a non-limiting aspect and in some embodiments the logic level associated with the enable signal may be low.

Aspects of the supply voltage level detector circuit 300 may be selected so to minimize temperature effects of the trigger voltage. There may be aspects of the resistors and/or transistors of the supply voltage level detector circuit 300 that may be sensitive to temperature. The temperature sensitivities may cause these aspects to increase or decrease with changes in temperature. These aspects may include the resistance of the resistors, the threshold voltage and the beta of the transistors. The beta of the transistors may be partially based on their size, e.g., the X parameter shown in FIG. 3. By selecting one or more of these parameters based on a given trigger voltage, the temperature effects of the trigger voltage may be limited. An equation showing the relationship of those parameters may be given as:

$$VPP = Vthn + (2/(R*beta))*((1-(1/\sqrt{K})) + L*(1-(1/\sqrt{K}))2) \qquad \text{Eq. (1)}$$

where VPP is the trigger voltage, Vthn is the threshold voltage of each of the three n-channel transistors 302, 304, and 306, R is the resistance of resistor 314, beta is the gain of each of the transistors, K is the relative size of transistor 304 with respect to the size of the transistors 302, 306, and L is the resistance value of the resistors 308, 310, and 312 with respect to the resistance value of resistor 314. As temperature increases, for example, Vthn may reduce at a rate of about −2.4 mV/degree, R may increase at a rate of about 0.2%/degree, and beta may reduce at a rate of about −0.5%/degree. Based on these example values, the term on the right side of the first addition symbol, e.g., the term within the parenthetical, may change at a rate of about 0.3%/degree. Accordingly, based on the example values, a Vthn may be selected that may limit or reduce the temperature dependence of VPP for a target VPP. As discussed above, the target VPP, e.g., the trigger voltage, may be selected between the specified highest output of a lower power supply and the specified lowest output of a higher power supply. Further, the Vthn may be selected so that the VPP's temperature variation stays between the voltage differences of the two voltage supply levels. For example, if the specified highest output of the lower power supply is 1.13 volts and the specified lowest output of the higher power supply is 1.71 volts, then the target VPP and the Vthn may be selects so that the temperature variation of the trigger voltage may stay within those two limits.

Figure 4:
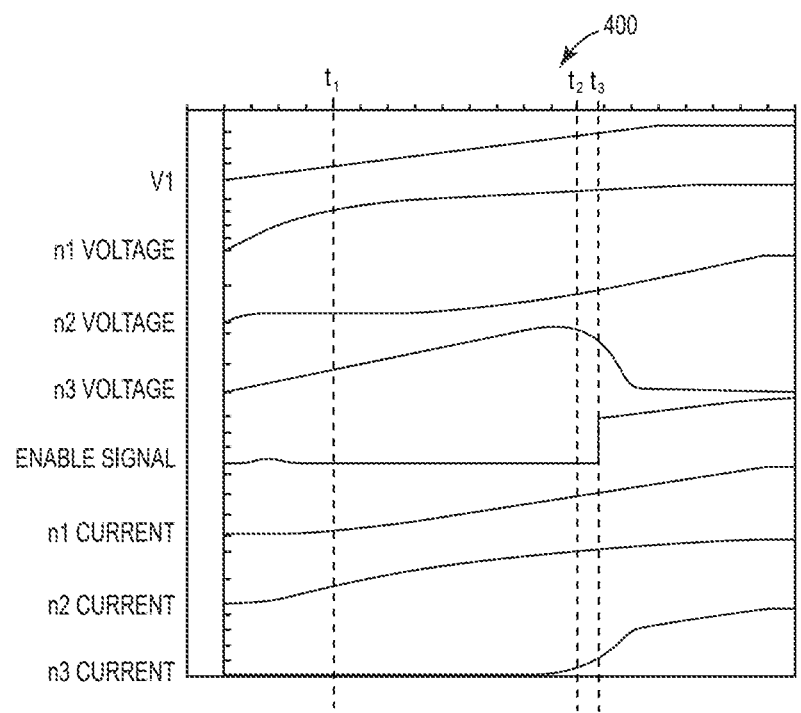
FIG. 4 is an example wave diagram in accordance with an embodiment of the present disclosure.

FIG. 4 is an example wave diagram 400 in accordance with the present disclosure. The wave diagram 400 depicts the voltages and currents occurring at the various nodes of the supply voltage level detector circuit 300 of FIG. 3 along with the enable signal. The waveforms shown in FIG. 4 will be discussed with regards to the circuit elements of FIG. 3 and may be used to disclose the operation of the supply voltage level detector circuit 300.

While not depicted in either FIG. 3 or 4, a device that includes the supply voltage level detector circuit 300, such as the memory 104 of FIG. 1, may also receive a supply voltage from at least one other power supply. For example, the device may receive supply voltages V1 and V2. In some embodiments, the specified supply voltage level V1 may be greater than the specified voltage level of a second power supply, such as supply voltage level V2. In this embodiment, it may be desirable to prevent enabling internal voltage generators, such as the internal voltage generators 204 of FIG. 2, until the supply voltage level V1 is greater than the supply voltage level V2. By ensuring supply voltage level V1 is greater than supply voltage level V2 before enabling internal voltage generators, for example, a device may limit or prevent powering up at an undesirable time.

In operation, the supply voltage level V1 may begin to ramp from zero volts to a specified voltage. Ramping from zero volts may occur when a host system powers up, for example. As V1 increases, the current flowing and voltages developing at each of the nodes n1, n2, and n3 may begin to increase. However, the respective increases in current and voltage occurring at each node may be different. The differences may be due to the configuration of the supply voltage level detector circuit 300 and further due to the differences in component parameters, such as L and K.

In reference to FIG. 4, as V1 ramps, the voltage at the node n1 may begin to increase. As the voltage at the node n1 increases, both transistors 302 and 304 may begin to turn on and conduct current. While the voltage at the node n1 may continue to increase with V1, the voltage at the node n2 may increase at a slower rate due to the voltage divider created in the second branch due to the resistors 310 and 314. However, the current flowing through the node n2 may increase more rapidly than the current flowing through the node n1 due to the larger area of the transistor 304. See for example the relative voltages and currents of n1 and n2 at time t1.

The voltage at the node n2 increasing at a slower rate delays when the transistor 306 turns on, which may prevent current flowing through the node n3. The voltage on the node n3 will increase with the increasing V1, which may cause an output of the inverter 316 to be low once the voltage on the node n3 is greater than one-half V1, for example. However, as the voltage on the node n2 continues to increase, the transistor 306 may turn on, which may cause current to flow through the node n3. As the current flowing through the node n3 begins to increase, the voltage on the node n3 may begin to decrease, as can be seen at time t2. Further, as the voltage on the node n3 continues to decrease, the input to the inverter 316 may fall below one-half V1, which may cause the output of the inverter to switch to provide a high logic state output signal, as shown in the step function occurring at time t3. The step function, e.g., the trigger point, may occur at the trigger voltage, which may occur when the current flowing through all three nodes is equal.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
   a terminal configured to receive a first voltage;
   a voltage reference circuit coupled to the terminal to receive the first voltage and configured to provide a second voltage responsive, at least in part, to the first voltage; and
   a voltage detector circuit configured to respond, at least in part, to the first and second voltages and configured to produce an output signal when the first voltage reaches a target level, the voltage detector circuit comprising:
      a first transistor including a gate configured to receive the second voltage; and
      a first resistor coupled in series between the terminal and the transistor;
   wherein the voltage reference circuit comprises:
   a second transistor including a gate, a source and a drain, wherein the drain is coupled to the terminal via a second resistor, the source is coupled to a reference voltage, and the gate coupled to a first node, wherein the first node is between the drain and the resistor; and
   a third transistor including a gate, a source, and a drain, wherein the drain is coupled to the terminal via a third resistor, the source is coupled to the reference voltage via a fourth resistor, and the gate is coupled to the first node.

2. The apparatus of claim 1, further comprising:
   an additional terminal configured to receive a third voltage, the targeted voltage being between the first and third voltages.

3. The apparatus of claim 2, wherein the first voltage is 1.8 volts and the third voltage is 1.2 volts.

4. The apparatus of claim 1, wherein the voltage detector circuit further comprises an inverter coupled to the first resistor and the first transistor and configured to provide an enable signal based on the output signal.

5. The apparatus of claim 1, wherein the first, second and third resistors have a resistance value that is substantially equal.

6. The apparatus of claim 5, wherein the third transistor is sized larger than the first and second transistors.

7. The apparatus of claim 5, wherein a resistance value of the fourth resistor is less than the resistance values of the first, second, and third resistors.

8. An apparatus comprising:
   a terminal configured to receive a first voltage of 1.8 volts,
   a voltage reference circuit coupled to the terminal to receive the first voltage and configured to provide a second voltage responsive, at least in part, to the first voltage:
      a voltage detector circuit configured to respond, at least in part, to the first and second voltages and configured to produce an output signal when the first voltage reaches a target level, the voltage detector circuit comprising:
         a first transistor including a gate configured to receive the second voltage; and
         a first resistor coupled in series between the terminal and the transistor; and
      an additional terminal configured to receive a third voltage, the targeted voltage being between the first and third voltages, wherein the third voltage is 1.2 volts.

9. A memory, comprising:
   a first circuit coupled between first and second voltage sources and configured to provide a second voltage based at least in part on a voltage provided by the first voltage source, the first circuit comprising:
      a first circuit branch coupled between the first and second voltage sources, wherein the first circuit branch includes a first transistor coupled between a first node and the second voltage source and a first resistor coupled between the first node and the first voltage source; and
      a second circuit branch coupled between the first and second voltage sources, wherein the second circuit branch includes a second transistor coupled between a second node and a second resistor, the second resistor coupled to the second voltage source, and a third resistor coupled between the first voltage source and the second node,
wherein a gate of the second transistor and a gate of the first transistor are coupled to the first node; and
a second circuit coupled between the first and second voltage sources and configured to receive the second voltage and provide an output signal when a voltage provided by the first voltage source reaches a trigger voltage, wherein the second circuit comprises:
a third circuit branch coupled between the first and second voltage sources, wherein the third circuit branch includes a third transistor coupled between a third node and the second voltage source and a fourth resistor coupled between the third node and the first voltage source, and wherein a gate of the third transistor is coupled to the second node.

10. The memory of claim 9, further comprising an inverter coupled to the third node, wherein the inverter is configured to receive the output signal and provide an enable signal in response thereto.

11. The memory of claim 9, wherein a resistance value of the first, third, and fourth resistors is greater than a resistance value of the second resistor.

12. The memory of claim 9, wherein a size of the second transistor is greater than a size of the first and third transistors.

13. The memory of claim 9, wherein the first, second and third transistors are n-channel transistors and a threshold voltage of each of the transistors is substantially equal.

14. The memory of claim 9, wherein the output is provided by the second circuit when a current flowing through each of the first, second, and third circuit branches are substantially equal.

15. The memory of claim 9, wherein the voltage provided by the first voltage source reaches the trigger voltage while ramping from a low voltage to a specified voltage.

16. The memory of claim 9, wherein the memory is a dynamic random access memory.

17. A method, comprising:
receiving a first voltage at a voltage detector circuit;
determining by the voltage detector circuit when a level of the first voltage reaches a trigger voltage;
wherein the voltage detector circuit includes first, second, and third circuit branches, and wherein determining by the voltage detector circuit when a level of the first voltage reaches a trigger voltage comprises determining when a current flowing through each of the first, second and third branches are substantially equal; and
based on the level of the first voltage reaching the trigger voltage, providing an enable signal by the voltage detector circuit.

18. The method of claim 17, wherein the trigger voltage is based on a difference between a specified level of the first voltage and a specified level of a third voltage.

19. The method of claim 18, wherein the current flowing through each of the first, second and third branches is based in part on the first voltage and further based on relative resistance values of resistors included in each of the first, second, and third branches, and relative sizes of transistors included in each of the first, second, and third branches.

20. The method of claim 18, wherein receiving a first voltage at a voltage detector circuit comprises receiving the first voltage at the voltage detector circuit when the first voltage is ramping from zero volts to a specified voltage level.

21. The method of claim 17, further comprising:
receiving at an inverter an output signal from the voltage detector circuit; and
providing by the inverter the enable signal in response.

* * * * *